United States Patent [19]

Katz

[11] Patent Number: 5,162,748
[45] Date of Patent: Nov. 10, 1992

[54] SWITCHABLE FET DISTORTION GENERATOR

[75] Inventor: Allen Katz, Trenton, N.J.

[73] Assignee: General Electric Company, East Windsor, N.J.

[21] Appl. No.: 799,659

[22] Filed: Nov. 29, 1991

[51] Int. Cl.$^5$ ............................ H03F 1/32; H03F 3/16
[52] U.S. Cl. .................... 330/149; 330/277; 307/490
[58] Field of Search ............. 330/149, 277, 286, 296; 307/490, 491, 497

[56] References Cited

U.S. PATENT DOCUMENTS

| | | | |
|---|---|---|---|
| 4,465,980 | 8/1984 | Huang et al. | 330/149 |
| 4,564,816 | 1/1986 | Kumar et al. | 330/149 |
| 5,038,113 | 8/1991 | Katz et al. | 330/277 |

Primary Examiner—Steven Mottola
Attorney, Agent, or Firm—William H. Meise; Stephen A. Young; Clement A. Berard

[57] ABSTRACT

A communications system includes a transmission channel in which, for efficiency, a processor such as an amplifier is operated in a nonlinear mode. When the signal is modulated in a manner which is affected by the nonlinearity of the processor, such as a multicarrier modulation, a distortion linearizer is used. The distortion linearizer incluees the source-to-drain conductive channel of a FET. The gate of the FET is coupled to ground by an impedance which may be a low inductance, and the gate is biased relative to the channel, possibly near pinchoff, to cause the channel to exhibit desirable gain expansion and phase shifts in response to signal input level, which are selected to compensate the distortion of the nonlinear processor. When the signal is modulated in a manner which is not significantly affected by the nonlinearity of the processor, as for example frequency modulation, the distortion linearizer is switched to a linear or ON mode, in which the amplitude and phase are invariant with signal level. The switching is accomplished by adjusting the gate-to-channel voltage.

6 Claims, 4 Drawing Sheets

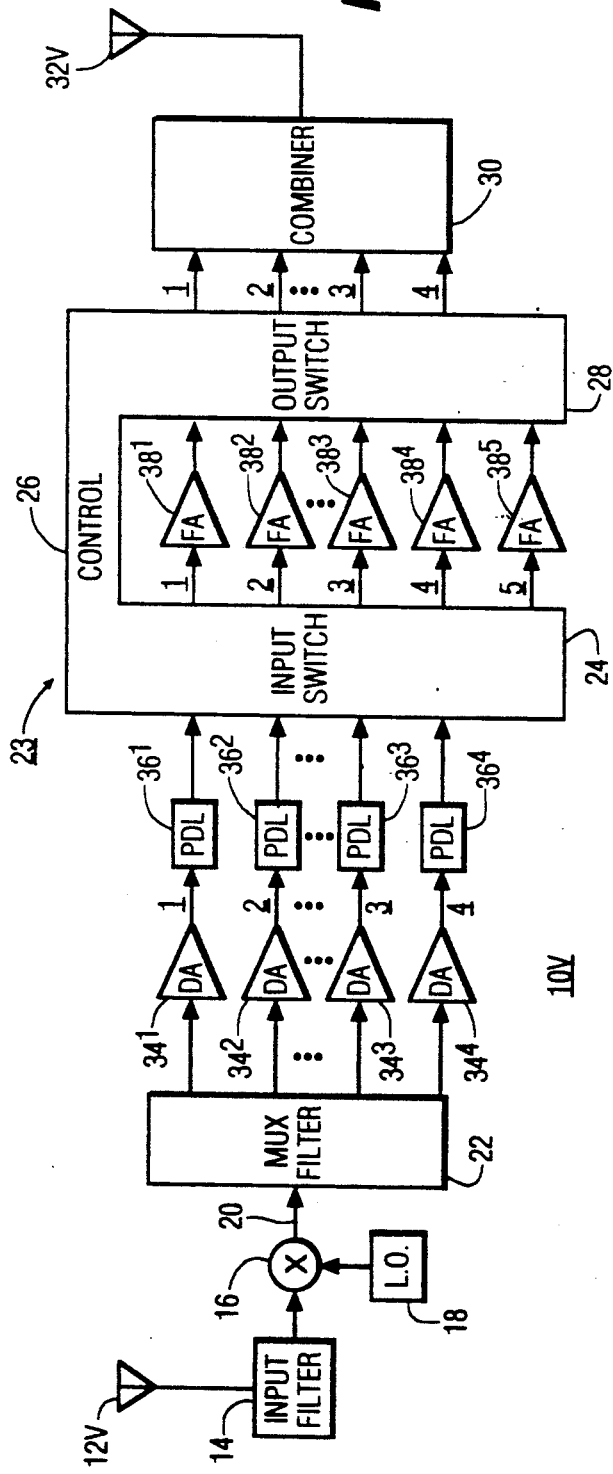
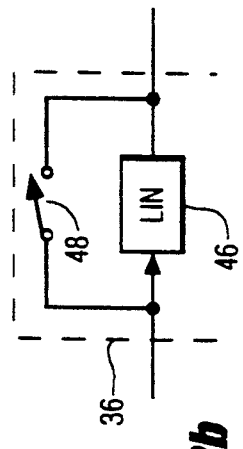

SWITCHABLE FET DISTORTION GENERATOR

BACKGROUND OF THE INVENTION

This invention relates to distortion generators for compensating the characteristics of unavoidable nonlinearities present in nominally linear systems such as amplifiers.

Copending U.S. patent application Ser. No. 07/772,207, filed Oct. 7, 1991 in the name of Wolkstein, describes a modern communications satellite which provides several broadband repeater channels. As described therein, the communications satellite receives from an earth station a plurality of signals within a cumulative frequency band, processes the received signals, as by low-noise amplification, filtration and block conversion to another frequency, and retransmits the processed signals to the same or another location.

FIG. 1 illustrates, as described in the abovementioned Wolkstein application, a satellite body 6 in accordance with the prior art, upon which are mounted a polarizing grid arrangement 8, vertically polarized receiving antenna 12V and horizontally polarized receiving antenna 12H. Receiving antennas 12V and 12H are coupled to vertical and horizontal signal processing arrangements 10V and 10H, respectively, located within body 6. Signal processing arrangements 10V and 10H process the received signals to produce signals to be retransmitted, which are broadcast by transmitting antennas 32V and 32H, respectively. Signal processing arrangement 10H is similar to vertical processing unit 10V, so only processing unit 10V is described.

The nature of the signals arriving at the satellite may be understood by reference to FIG. 1b. The vertically-polarized signals arriving at antenna 12V by way of polarizing grid 8 includes a plurality of signals centered at different frequencies f1, f2, f3. The amplitude spectra of various of these signals are designated V1, V2, V3 in FIG. 1b. Some of the signals arriving at antenna 12H of FIG. 1a, with horizontal polarization are illustrated (in dashed lines) as H1, H2 in FIG. 1b. In a typical satellite system, there may be 10 or more vertical (V) and 10 or more horizontal (H) channels, with their frequencies of operation interleaved as shown in FIG. 1b. The bandwidth of a signal such as signal V2 may be sufficient to carry a television channel, or more. Thus, the bandwidth of a signal such as V2 may be 6 Mhz or more. Vertical processing channel 10V of FIG. 1a may, as a consequence, receive 10 or more signals V1, V2, V3 . . . V$_N$, each six or more Mhz wide, which are separated from each other by a like amount. Thus, the total frequency bandwidth occupied by the vertical signals may be 120 Mhz or more, calculated as [10(V) +10(H)]×6. The center frequency of the 120 Mhz band may be, for example, at 14 GHz.

The 10 or more vertical signals V1, V2 . . . received by antenna 12V of FIG. 1a are coupled to an input filter 14 of channel 10V, for reducing noise and preventing interference. Filter 14 is a bandpass filter with a bandwidth substantially equal to the total bandwidth of the vertical signals. The filtered signals are coupled from input filter 14 to a low noise amplifier (not illustrated) if required and then to a block converter including a mixer 16 and a local oscillator 18. The frequency of local oscillator 18 is selected to convert the 14 GHz center frequency to some other center frequency, such as 12 GHz. The downconverted 12 GHz signals are applied over a transmission path 20 to a multiplexing (MUX) filter 22. Multiplexing filter 22 separates signals V1, V2, V3 . . . from each other in accordance with their frequencies. Multiplexing filter 22 is the starting point for a plurality of separate channels designated generally as 1, 2, . . . 3, 4. If there are 10 vertical signals V1, V2, V3 . . . then the number of channels in signal processor 10V is also 10. The signal in each of channels 1, 2, . . . 3, 4 is one of the signals V1, V2, . . . In effect, filter 22 is a source of signals at a plurality of different frequencies, driving a like plurality of separate channels.

In general, the signals on channels 1, 2, . . . 3, 4 in FIG. 1a are amplified, the distortion generated due to the amplification is compensated, and the amplified and distortion corrected signals are applied to a combiner or demultiplexer 30, which may be a filter similar to filter 22 operated in reverse, or it might be a group of hybrid combiners which do not discriminate based upon frequency. The combined signals at the output of combiner 30 are applied to a transmitting antenna 32V for transmission back to an Earth station, or possibly to another satellite.

System considerations such as the signal strength of the signal available at the satellite, the receiving antenna gain, and the transmitting antenna gain and field strength required to reach the ground station establish the overall power gain which must be provided in each channel between receiving antenna 12V and transmitting antenna 32V.

Within any channel 1, 2, . . . 3, 4 of FIG. 1a, the signal is processed by the cascade of a driver amplifier (DA) 34, a distortion linearizer such as a predistortion equalizer (PDL) 36, and a power amplifier or final amplifier (FA) 38. For example, as illustrated in FIG. 1a, the cascade of a DA 34$^2$, PDL 36$^2$ and FA 38$^2$ amplifies the signals for channel 2. As illustrated in FIG. 1a, an additional cascade of a DA 34$^5$, PDL 36$^5$, and FA 38$^5$ is connected in cascade, to define an extra or supernumerary "channel" designated 5. Channel 5 is not connected for handling signal, but instead represents a reserve cascade which may be substituted into any of the other channels in which the cascade may become defective. To this end, connection between input filter 22 and the inputs of the various channel cascades 34, 36, 38 is provided by means of an input switch arrangement designated 24, and connection between the outputs of final amplifiers 38 and combiner 30 is provided by an output switch arrangement designated as 28. A switch control arrangement illustrated as 26 gangs the input and output switches for simultaneous operation, and responds to signals in response to evidence of failure, generated on the ground or autonomously by control circuits within the spacecraft itself. Thus, in the event that the cascade of DA 34$^1$, PDL 36$^1$, and FA 38$^1$ fails completely or becomes degraded, the reserve cascade including DA 34$^5$, PDL 36$^5$, and FA 38$^5$ can be substituted therefor, with the cascade of DA 34$^1$, PDL 36$^1$, and FA 38$^1$ being removed from on-line use. Naturally, additional redundant units may be provided, and if the number of failures should exceed the number of redundant units, the switching arrangement including 24, 26 and 28 may move operable cascades from lower-priority uses to higher-priority uses. In order to be switchable to obtain this level of reliability, each cascade must have an instantaneous frequency bandwidth covering the cumulative or total bandwidth of the vertical signals V1, V2, V3, . . .

As further described in the aforementioned Wolkstein application, modern broadband final amplifiers are recognized as having very similar distortion characteristics among themselves. The switching arrangement is repositioned by Wolkstein as in FIG. 2a so that the distortion equalizers are fixedly associated with the individual channel, rather than being switchable together with the amplifier. As a result, the distortion equalizer may be designed and optimized during manufacture for the relatively narrow bandwidth of the channel, rather than for the total bandwidth of all the channels.

Elements of FIG. 2a corresponding to those of FIG. 1a are designated by the same reference numerals. In FIG. 2, each cascade of a driver amplifier 34, predistortion equalizer 36, and final amplifier 38 is redistributed relative to FIG. 1 so that the driver amplifier and predistortion limiter are fixedly associated with each channel, between the multiplexing filter 22 (the effective input of the channel) and the input of switching arrangement 24. Thus driver amplifier $34^1$ and predistortion linearizer $36^1$ are cascaded between the channel 1 output of multiplexing filter 22 and input switch 24. As illustrated in FIG. 2a, switch arrangement 23 connects final amplifier $38^1$ in channel 1. The net gain in channel 1 between the channel 1 output of multiplex filter 22 and the channel 1 input of combiner 30 is identically the same as in the arrangement of FIG. 1a (assuming, of course, that the elements themselves are identical). Similarly, the gains through each of the channels of FIG. 2a are the same as in FIG. 1a. However, only the final amplifiers 38 are required to have the cumulative bandwidth of all the vertical-polarization channels if the redundancy scheme so requires, while the driver amplifiers and predistortion linearizers require only the relatively narrow channel bandwidth. For the previous example of 10 vertical channels, each with 6 MHz bandwidth, the driver amplifiers and predistortion linearizers are required to have only a 6 MHz bandwidth in the arrangement of FIG. 2a, compared with a bandwidth of 120 MHz in the prior art arrangement of FIG. 1a. It should be noted that the block conversion reduces the center frequency but not the cumulative bandwidth, so the percent bandwidth is increased by the block conversion.

FIG. 2b is a simplified block diagram of a portion of the arrangement of FIG. 2a, as described by Wolkstein. In particular, predistortion linearizer 36 may include a linearizer 46, which may be a conventional linearizer such as is described in U.S. Pat. No. 5,038,113 issued Aug. 6, 1991 in the name of Katz et al. As illustrated in FIG. 2b, linearizer 46 is bypassed by a controllable switch 48, in order to switch the linearizer out of service. This may be desired, for example, when the following amplifier is to amplify FM-modulated signals such as TV video, which has lesser linearity requirements than multicarrier operations, so the amplifier can be run at a higher output level. Those skilled in the art realize that while switch 48 is illustrated by a mechanical switch symbol, switches adapted for GHz (or higher) frequency ranges must be used when appropriate and may be electronic rather than mechanical in nature. Further, in order to avoid impedance perturbations, a switch such as 48, bypassing linearizer 46, may also include, for impedance improvement, other switch portions intended for disconnecting linearizer 46 from the line when bypass switch 48 is closed. Wolkstein suggests improving reliability by using redundant linearizers. Enhanced system reliability is desired.

SUMMARY OF THE INVENTION

A FET linearizer includes a controllable signal path extending between source and drain electrodes. As described in the Katz et al '113 patent, the gate is coupled by a predetermined impedance to a reference potential. In one embodiment, the impedance is an inductance in series with a variable capacitor. A direct bias voltage is applied between the gate and the controlled current path, which voltage is selected, in conjunction with the gate impedance, to impress a desired degree of distortion on signals traversing the controllable source-to-drain (or drain-to-source) controllable path. As described in the Katz et al patent, the FET linearizer may be operated in transmissive and reflective modes. In accordance with the invention, reliability is enhanced and weight and complexity are reduced in a transmission-type FET linearizer, by selectively operating the FET in a first distortion correcting mode generally as described in the Katz et al patent, and in a second mode which may be characterized as an ON mode, in which the FET acts as an essentially linear transmission path. In a particular embodiment of the invention, the ON mode is selected by connecting the FET gate to reference potential.

DESCRIPTION OF THE DRAWING

FIG. 1b illustrates a simplified portion of an amplitude-frequency spectrum associated with the arrangement of FIG. 1a;

FIG. 2a is a simplified block diagram which illustrates a portion of a spacecraft communication system as described in the aforementioned Wolkstein application, and FIG. 2b is a portion therefore;

DESCRIPTION OF THE INVENTION

The invention recognizes that switch 48 bypassing the linearizer 46 of FIG. 2b can be implemented as a transmission FET. Such a FET is itself inherently very reliable when, in normal operation, gate current does not flow. The parts count can be reduced, and overall reliability thereby enhanced, by using the distortion equalizer FET for the additional purpose of passing signal therethrough in a linear manner. Thus, the "switch" and the "linearizer" use much of the same structure, the parts count and weight are reduced, and reliability is enhanced. The parts count and weight reduction are significant when, as in the satellite of FIGS. 1a and 2a, twenty or more channels are used, each with a linearizer.

Figure 3:
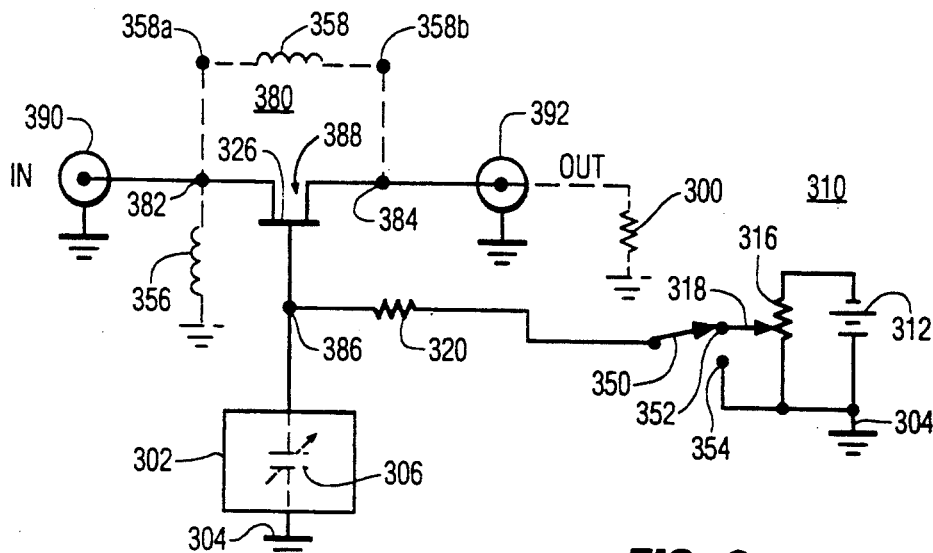
FIG. 3 is a simplified schematic diagram of a FET translation circuit according to the invention which operates in two modes, a distortion mode and a linear mode.

FIG. 3 is a simplified schematic diagram of a dual-mode FET translation circuit according to the invention, which performs the same functions as the apparatus of FIG. 2b but with a reduced parts count. In FIG. 3, a distortion generator 380 as described in Katz et al, U.S. Pat. No. 5,038,113 includes a FET 388 with source electrode 382, drain electrode 384, and gate electrode 386. Source electrode 382 is coupled (by matching networks, if needed) to an input port 390, and drain electrode 384 is similarly coupled to an output port 392. A gate-to-ground (or gate-to-reference) impedance 302 is connected between FET gate electrode 386 and ground 304. As described in detail in Katz et al '113, appropriately selected gate impedances, together with a gate bias voltage, cause the FET to controllably distort signals travelling from input port 390, and through the FET source-to-drain controllable (channel) 326 to output port 392. As also described therein, direct gate voltage (also known as direct current or dc) is applied between gate electrode 386 and controllable path 326 by a generator, designated generally as 310 in FIG. 3.

Generator 310 of FIG. 3 includes a source of direct voltage illustrated by a battery symbol 312. The direct voltage is selected in a manner represented by a potentiometer designated 316 and an associated movable "wiper" 318. Those skilled in the art know that these are only symbolic representations, and that in actuality more complex or electronically commanded sources are ordinarily used when the voltage is to be selected, and that once the operating point of a particular FET has been established, the variability feature is unnecessary and may be dispensed with. The selected direct bias voltage is generated on wiper 318 of generator 310. As so far described, the arrangement of FIG. 3 corresponds to the Katz et al '113 description.

As illustrated in FIG. 3, wiper 318 is connected to gate electrode 386 by a switch represented as a mechanical switch element 350 which is movable between positions contacting a first switch terminal 352 and a second switch terminal 354. In the position of switch element 350 which is illustrated in FIG. 3, the direct bias voltage is coupled from wiper 318, through an isolation apparatus illustrated as a resistor 320, to gate electrode 386. In order for the gate voltage to be applied across the gate (386)-to-channel (326) controllable path 326, a circuit is completed by the connection of an electrode (not separately designated) of battery 312 to ground or common return 304, together with the load impedance, represented by a resistor 300, coupled between output port 392 and ground. If there is no direct-current path between ground and source 382 or drain 384, a radio-frequency choke (RFC) or other impedance elements constituting a bias tee may be coupled from one or both electrodes to ground, as suggested by RFC 356 coupled from source 382 to ground. Also, the linearizer FET 388 may be bridged by an impedance for further control of the nonlinearity, as described in a copending application of Katz et al entitled, "Wideband Transmission-Mode FET Equalizer", as suggested by inductor 358, having terminals 358a and 358b, connected between source electrode 382 and drain electrode 384.

In accordance with the invention, the bias voltage is changed by operation of switch 350, to decouple gate 386 from that bias voltage (produced by generator 310) which sets conductive path 326 into a desired nonlinear condition, and to instead couple the gate to a source of voltage which causes conductive path 326 to take on essentially a linear conducting condition, corresponding to the ON or conducting condition of switch 48 of FIG. 2b. As illustrated in FIG. 3, the voltage coupled by switch 350 to gate electrode 386 is 0 volts or ground. Thus, in the alternate position (not illustrated in FIG. 3) movable switch element 350 makes contact with switch terminal 354, which is connected to ground 304. Consequently, in the described alternative position of switch element 350 in FIG. 3, gate electrode 386 is connected to ground by way of its isolation circuit 320, switch element 350 and terminal 354. With gate electrode 386 at ground potential and drain electrode 384 also at ground potential as to direct current because of the characteristics of load impedance 300 (or because of RFC 356 and inductor 358, the FET assumes a linear ON operating mode, in contrast to the nonlinear operating mode when switch element 350 is in the illustrated position to apply bias voltage to gate electrode 386.

Those skilled in the art will recognize that certain simplifying assumptions have been made in the above description. One simplification is to assume that the gate current is zero, and that the impedance of load impedance 300 is small enough so that the bias current flowing therethrough results in no voltage drop. While not strictly true, the direct gate current can be expected to be in the microampere range, or less, and for typical load impedances of 50 or 75 ohms in microwave circuits, or even for a few hundred ohms, the voltage offset attributable to drop across the load impedance is negligible by comparison with the gate bias voltages near the one-volt level.

For a Nippon Electric type NE673 GaAs FET, the ON mode occurs at or near 0 volts, and a nonlinear operating mode, useful for predistortion of signals in the 11 to 13 GHz range, occurs at about $-0.9$ volts. The bias which results in useful nonlinear operation occurs near pinchoff of this FET, and varies from FET to FET and with the desired degree of nonlinearity. To indicate the general range of voltages in this particular application, bias voltages from about $-0.8$ to about $-1.4$ volts have provided satisfactory nonlinearity with this type of FET, and voltages of 0 to about $+0.3$ volts are satisfactory for the ON operating mode.

Figure 4:
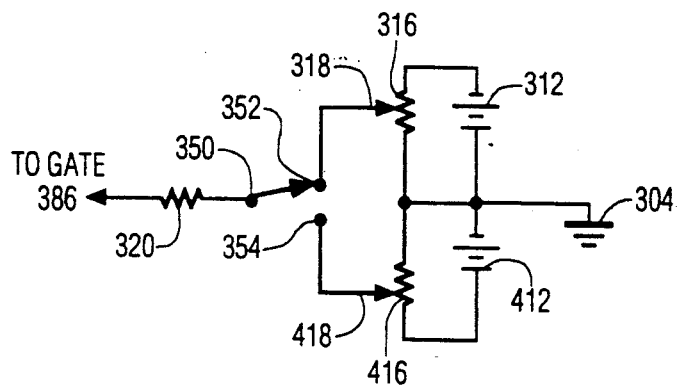
FIG. 4 is a simplified schematic diagram of an alternate arrangement of a portion of FIG. 3.

FIG. 4 is a simplified schematic diagram of a portion of the arrangement of FIG. 3, with a switched bias source which would be suitable for applying a voltage in the range of 0 to about $+0.3$ volts in the ON operating mode. Elements of FIG. 4 corresponding to those of FIG. 3 are designated by like reference numerals. In FIG. 4, an additional voltage source which is positive with respect to ground is represented by a battery 412. A further potentiometer 416 is connected between the positive terminal of source 412 and ground, and its movable element 418 selects the desired positive bias voltage for the ON operating mode and supplies it to switch terminal 354. In the illustrated position of movable switch element 350, the operating bias near $-0.9$ volts for the nonlinear operating mode is supplied to gate electrode 386, and in the alternate position of switch element 350, the ON mode bias voltage in the range of 0 to $+0.3$ volts is coupled from switch terminal 354 to gate electrode 386.

Figure 1A:
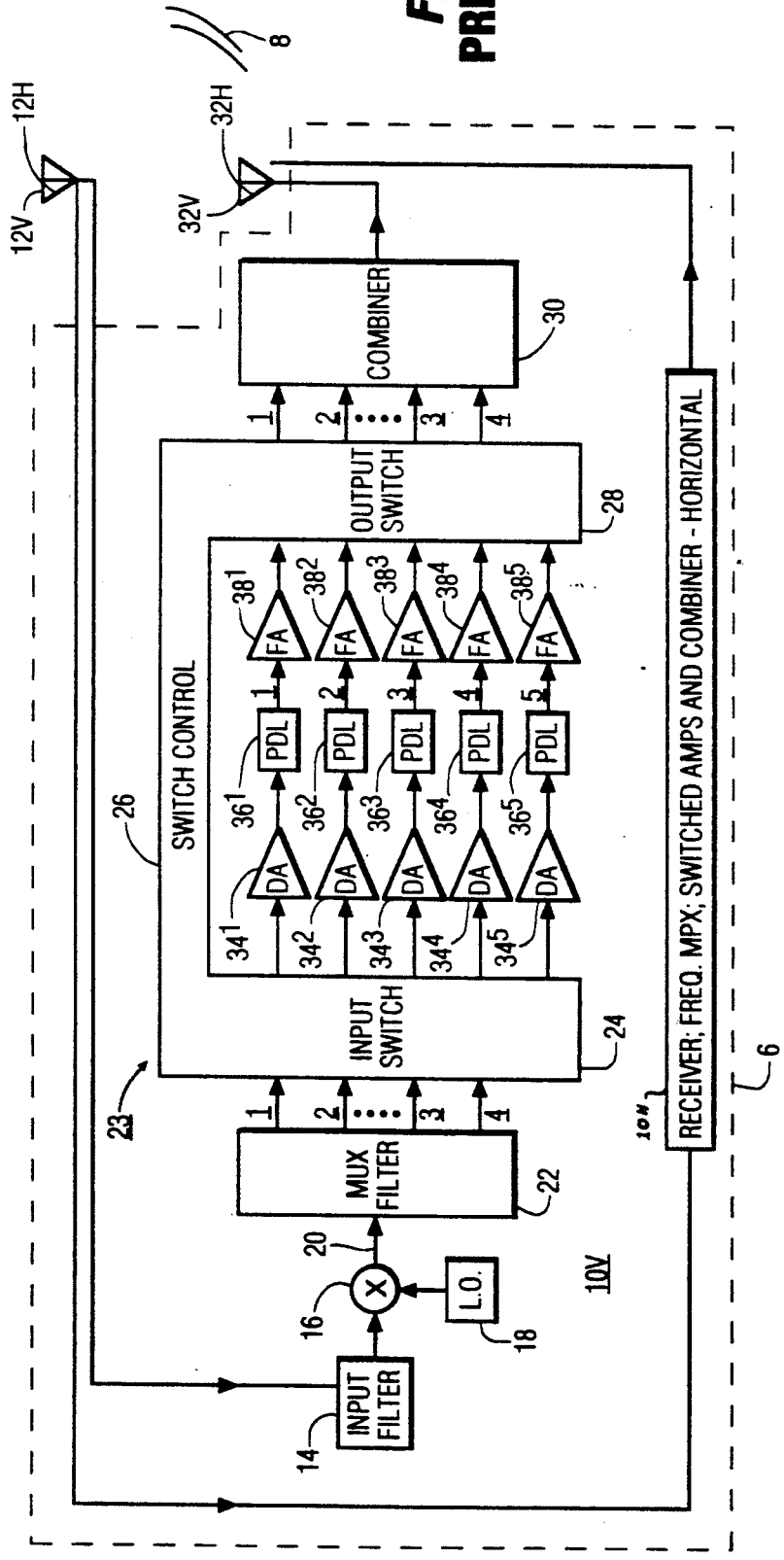
FIG. 1a is a simplified block diagram of a prior art spacecraft communication system.
Figure 1B:
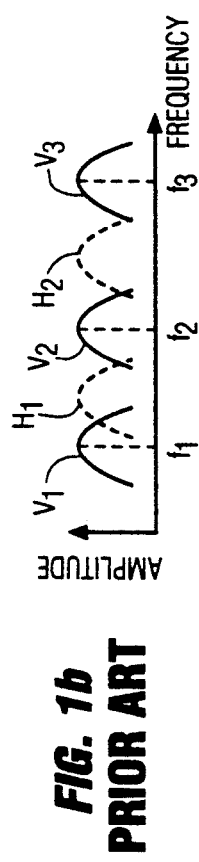

In operation of the communication systems of FIGS. 1a or 2a with switched linearizers as illustrated in FIG. 3 or FIG. 3 with FIG. 4, conventional command channels (not illustrated) are used to send commands from a ground station to the satellite to control the "position" of movable switch element 350 between its position for nonlinear mode operation and its alternate "linear" ON operating mode.

Figure 5:
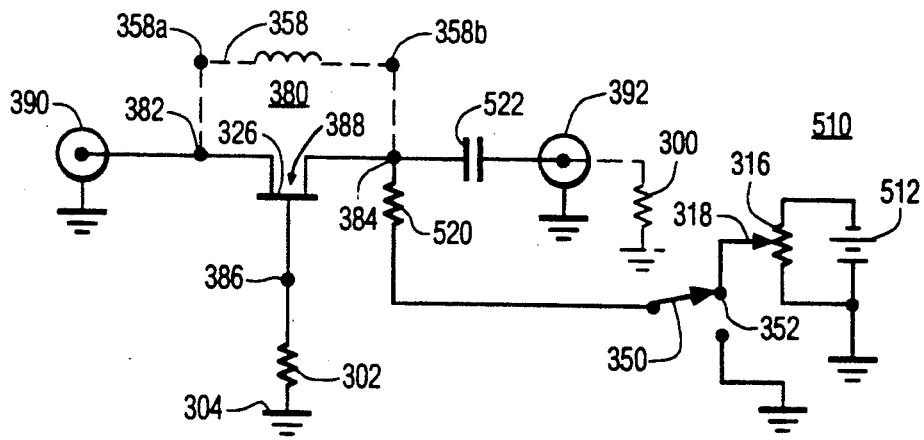
FIG. 5 is a simplified schematic diagram of an alternate arrangement for coupling bias to the FET of FIG. 3.

FIG. 5 is similar to FIG. 3, and corresponding elements are designated by the same reference numerals. In FIG. 5, gate electrode 386 is connected to ground by a gate-to-ground impedance 302, which is galvanically conductive (i.e. conducts direct current). Thus, gate electrode 386 is connected to ground for direct voltage. In order to apply a bias voltage which makes gate electrode 386 negative with respect to a source or drain electrode, the bias voltage source 510, which is represented as including a positive source 512 with potentiometer 316 producing the selectable voltage or wiper 318, is coupled to terminal 352 of switch 350. The bias voltage is coupled through switch 350 (in the illustrated position), by way of an isolation device illustrated as a resistor 520, to drain electrode 384. If needed, as for example if load impedance 300 significantly loads bias source 510, a decoupling capacitor (also known as a coupling capacitor), illustrated as 522, may be interposed between drain electrode 384 and output port 392. The same may be done, instead or in addition, in relation to the source electrode 382 and port 390, if required.

Figure 6A:
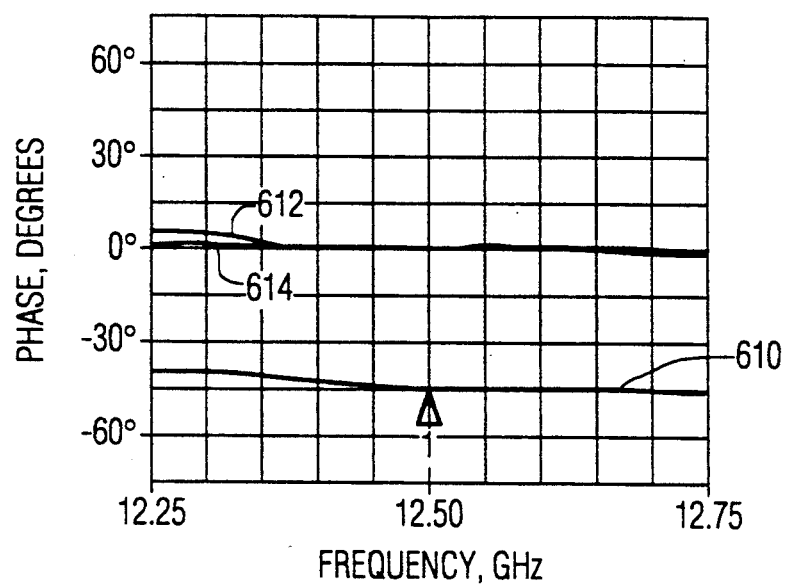
FIG. 6a is a plot of phase response versus frequency of the arrangement of FIG. 3 for linear or ON and nonlinear operating modes.

FIG. 6a plots signal phase versus frequency over the range of 12.25 to 12.75 GHz for the structure of FIG. 3, in the nonlinear and linear ON modes. In FIG. 6a, plot 610 represents the phase angle versus frequency of the structure of FIG. 3 at a gate bias voltage of about −0.9 volts (nonlinear mode), at relatively low linearizer input signal levels (−25 dBm), while plot 612 represents relatively high input levels (in the vicinity of 0 dBm). As illustrated, plot 610 deviates by no more than about 5° over the 12.25 to 12.75 GHz frequency band. At the high input power level, the phase shift differs from that at low input power levels by about 45°. Plot 614 represents the phase of the structure of FIG. 4 with the gate at zero volts (the ON condition), at both high and low input signal levels. As illustrated, there is no change in phase over the frequency band as a function of signal level, which means that the apparatus is linear. Also, the phase shift is essentially zero degrees in the ON mode.

Figure 6B:
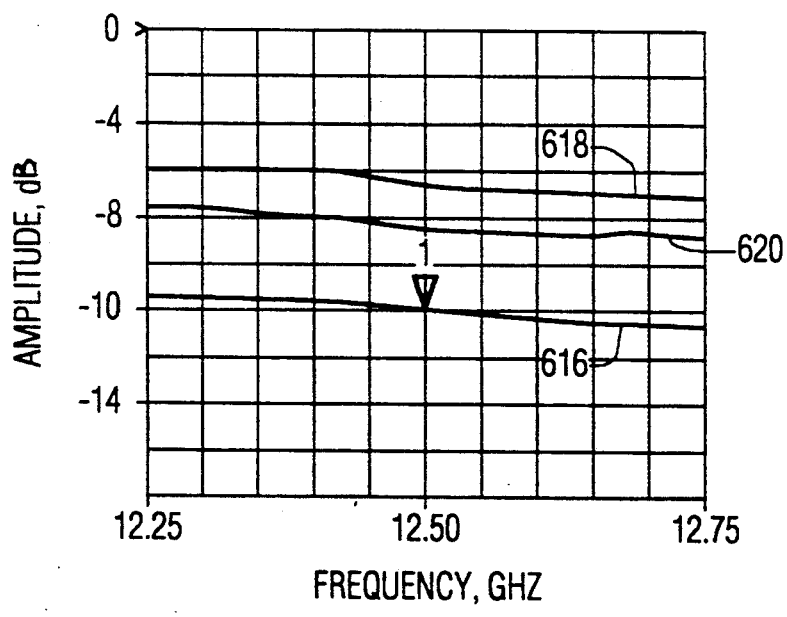
FIG. 6b is a corresponding amplitude plot.

FIG. 6b plots output amplitude versus frequency over the range of 12.25 to 12.75 GHz of the structure of FIG. 3. Plot 616 represents the amplitude response at the relatively low −25 dBm input signal level at a gate bias voltage of about −0.9 volts, while plot 618 represents the 0 dBm input signal level. As illustrated, the loss decreases by about six dB for an increase of about 25 dB in input signal level. Plot 620 represents the amplitude response at zero gate volts at both input signal levels −25 dBm and 0 dBm. It is clear that there is no amplitude difference, and the FET operates linearly.

Other embodiments of the invention will be apparent to those skilled in the art. For example, rather than sending commands to switch element 350 from a ground station, an autonomous control system may make the selection in response to operating conditions. Also, the voltage generated by battery 312 (or the position of movable wiper 318) or the electronic equivalent, may be adjusted from the ground to vary the amount of nonlinearity in the nonlinear operating mode to compensate for changes in nonlinearity of the associated amplifier which may result due to aging or other effects.

Since the FET is ordinarily essentially symmetrical, the source and drain electrodes may be interchanged.

What is claimed is:

1. A switchable distortion generator for, within a particular frequency range, distorting at least one of (a) amplitude and (b) phase of signal to be distorted, in response to the amplitude of said signal to be distorted, said circuit comprising:
   a FET including a gate electrode, and also including source and drain electrodes and a controllable path for the flow of signal therebetween;
   impedance means coupled between said gate electrode and a point of reference potential, said impedance means being selected to have a range of values, within said frequency range, for coacting with a bias for controlling said FET for distortion of said signals traversing said controllable path;
   inductance means including first and second ends;
   first coupling means coupled to said inductance means and to said FET, for coupling said first end of said inductance means to said source electrode and said second end to said drain electrode, for providing a path for flow of said signal parallel to said controllable path;
   switchable bias generating means coupled to said gate electrode, and to said controllable path, for selectively generating a voltage, said voltage being selectable to be one of a fixed first voltage and a second voltage, said first voltage being selected at a value such that, when applied across said gate electrode and said controllable path, causes said FET to become conductive in a substantially linear operating mode, and said second voltage being selectable in conjunction with the value of said reactance means to a value within a range in which, when said second voltage is applied across said gate electrode and said controllable path, said FET operates in a nonlinear mode exhibiting significant nonlinearity to signals traversing said controllable path.

2. A distortion generator in accordance with claim 1, wherein said bias generating means includes means for, in said linear operating mode, coupling zero voltage across said gate electrode and said controllable path.

3. A distortion generator in accordance with claim 2, wherein said bias generating means includes means for, in said linear operating mode, coupling said gate electrode to a source of direct reference voltage.

4. A method for operating a communications system at a frequency, said method comprising the steps of:
   applying a signal at said frequency, which signal is to be amplified, to one of the source and drain electrodes of a FET which has its gate electrode coupled to reference potential by a predetermined impedance;
   taking the signal from the other one of said source and drain electrodes of said FET to an input of an amplifier for amplification, whereby said amplifier distorts the signal and distortion correction may be desired;
   when distortion correction is desired, applying a first direct voltage to at least one of said gate, source and drain electrodes so as to bias said FET near pinchoff, to thereby correct said distortion; and
   when distortion correction is not required, applying a second direct voltage to at least one of said gate, source and drain electrodes so as to bias said FET in a linear operating mode.

5. A method according to claim 4, further comprising the step of simultaneously generating said first and second direct voltages, and performing said steps of applying by switching between said first and second direct voltages.

6. A switchable distortion generator for, within a particular frequency range, distorting at least one of (a) amplitude and (b) phase of signal to be distorted, in response to the amplitude of said signal to be distorted, said circuit comprising:
- a FET including a gate electrode, and also including source and drain electrodes and a controllable path for the flow of signal therebetween;
- impedance means coupled between said gate electrode and a point of reference potential, said impedance means being selected to have a range of values, within said frequency range, for coacting with a bias for controlling said FET for distortion of said signals traversing said controllable path;
- inductance means including first and second ends;
- first coupling means coupled to said inductance means and to said FET, for coupling said first end of said inductance means to said source electrode and said second end to said drain electrode, for providing a path for flow of said signal parallel to said controllable path;
- switchable bias generating means coupled to at least one of said gate electrodes, said source electrode and said drain electrode for selectively generating a voltage, said voltage being selectable to be one of a first voltage and a second voltage, said first voltage being selected at a value such that, when applied to said one of said electrodes, causes said FET to become conductive in a substantially linear operating mode, and said second voltage being selectable to a value in which, when applied to said one of said electrodes, causes said FET to operate in a nonlinear mode exhibiting significant nonlinearity to signals traversing said controllable path.

* * * * *